United States Patent [19]
Larson

[11] Patent Number: 5,443,003
[45] Date of Patent: Aug. 22, 1995

[54] STRETCHING FRAME FOR USE IN SILKSCREENING

[76] Inventor: James D. Larson, 6323 83rd Ave. SE., Snohomish, Wash. 98290

[21] Appl. No.: 146,927

[22] Filed: Nov. 3, 1993

Related U.S. Application Data

[63] Continuation-in-part of Ser. No. 985,559, Dec. 3, 1992, abandoned.

[51] Int. Cl.⁶ ............................................. B05C 17/06
[52] U.S. Cl. .................................. 101/127; 101/129; 101/126; 101/128.1
[58] Field of Search ............... 101/126, 127, 127.1, 101/128, 128.1, 415.1, 129

[56] References Cited

U.S. PATENT DOCUMENTS

| | | | |
|---|---|---|---|
| 3,416,445 | 12/1968 | Krueger, Jr. | 101/128.1 |
| 3,750,186 | 7/1973 | Sakamoto | 101/127.1 |
| 4,430,814 | 2/1984 | Wule | 101/127.1 |
| 4,430,815 | 2/1984 | Wule | 101/127.1 |
| 4,852,483 | 8/1989 | Bussard | 101/128 |
| 4,860,467 | 8/1989 | Larson | 101/127.1 |
| 5,018,442 | 5/1991 | Hamu | 101/127.1 |
| 5,113,611 | 5/1992 | Rosson | 101/127.1 |
| 5,152,219 | 10/1992 | Adachi et al. | 101/127.1 |
| 5,274,934 | 1/1994 | Newman, Jr. | 101/128.1 |
| 5,327,828 | 7/1994 | Basocas et al. | 101/127.1 |
| 5,390,596 | 2/1995 | Farr | 101/129 |

*Primary Examiner*—Edgar S. Burr
*Assistant Examiner*—Lynn D. Hendrickson
*Attorney, Agent, or Firm*—Jensen & Puntigam

[57] ABSTRACT

A longitudinal strip for use in silkscreening, adapted to have attached thereto the screening fabric, said strip including an interlocking mechanism such that when the screen is under tension the strip is securely fastened to the side frame element of a retensionable silk screen frame. The strip may be preformed and the screen cut and attached thereto to reflect and accommodate the flexure of the frame when the tension, appropriate to the material, is applied thereto.

5 Claims, 5 Drawing Sheets

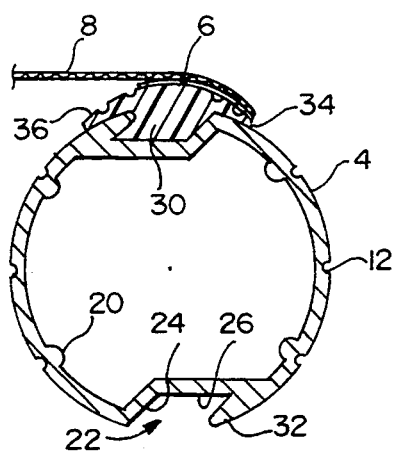
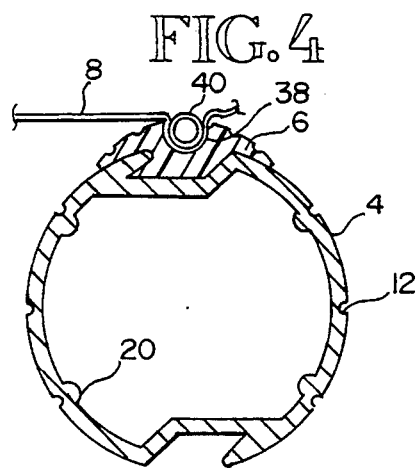
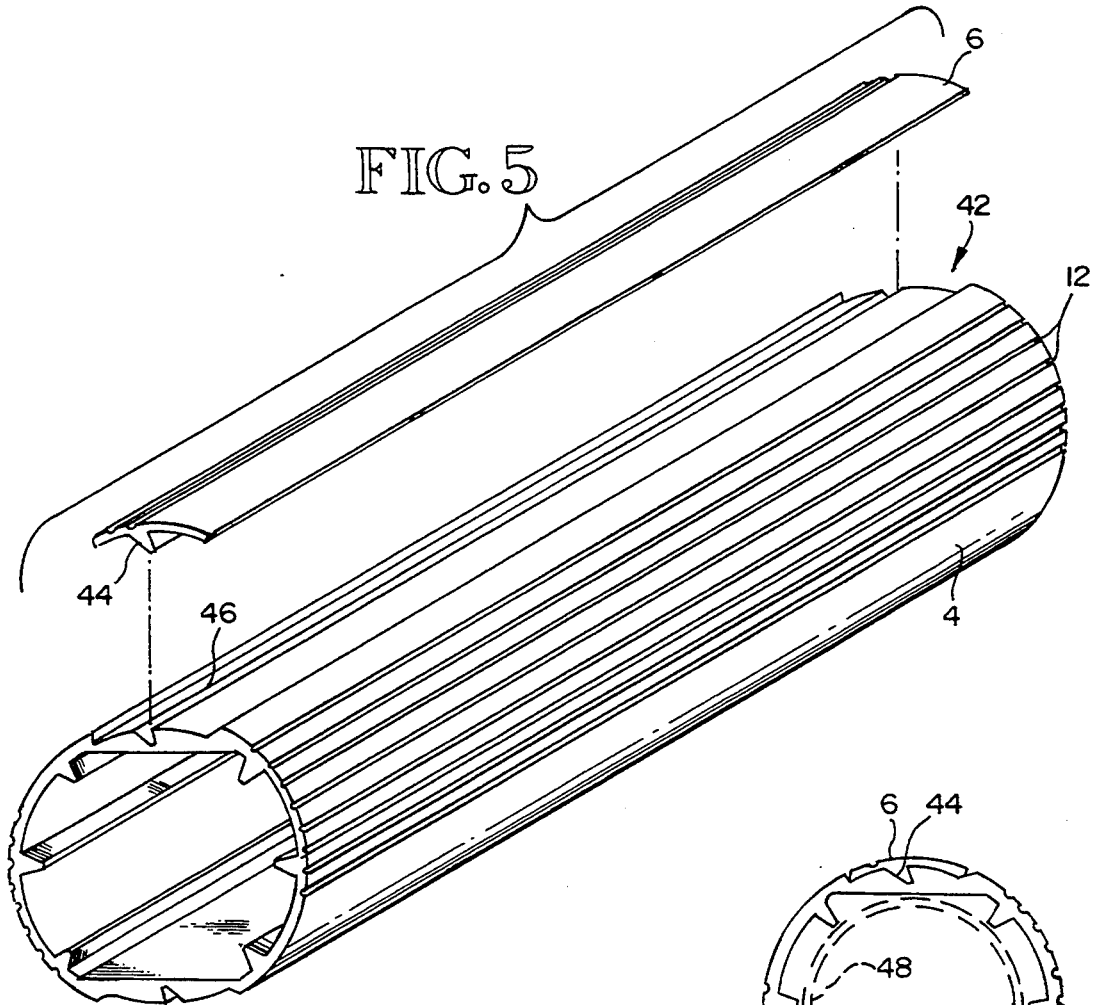
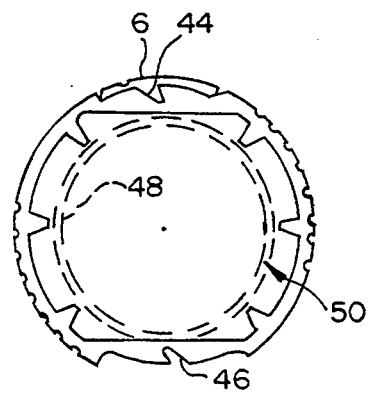

STRETCHING FRAME FOR USE IN SILKSCREENING

This application is a continuation-in-part of Ser. No. 07/985,559 filed Dec. 3, 1992, now abandoned.

TECHNICAL FIELD

This invention relates to a silk screen stretching frame and, more particularly, to a stretching frame which allows the temporary removal and replacement of the screen fabric. An alternate approach is to provide a precut screen fabric including an attached flexible edge, which compensates for the flexure of the frame and the fabric, for removable attachment to the frame.

BACKGROUND OF THE INVENTION

Historically, silk screening has been used for inexpensive decoration of materials, including clothing such as Tee shirts and the like, since a selected pattern can be reproduced with minimal labor and expense. More recently, designer clothes have also been silkscreened.

One of the drawbacks of silk screening lies in the fact that if a particular pattern was believed to be of the type which would be in demand for an extended period, then the screen would be stored, such that it could be reused without having to be replaced. This, of course, required utilization of a higher quality screen so that it could withstand the multiple usage, but beyond this concern a difficulty existed in the storage of the screen itself. Since the screen is stretched on a frame so that it can reproduce with high quality and integrity, it cannot be easily removed and replaced. Because of the difficulty in removing and replacing, these screens have historically been stored on the frame, which requires additional storage space, since the frame is bulky. This storage method further required that the person doing the screening carry an inventory of frames, since, obviously, a frame that is in storage cannot be used for another screening job until the initial screen has been removed and replaced.

Over the years, a large variety of means have been used for stretching fabric or the like, and these are illustrated by U.S. Pat. No. 484,137 granted to Caufield, Oct. 11, 1892, which discloses a device for keeping leather under tension during the curing process and includes means for adjusting the tension.

U.S. Pat. No. 673,197 granted to Collins, Apr. 30, 1901, discloses a device for stretching a garment.

U.S. Pat. No. 721,749 granted to Sanders, Mar. 30, 1903, discloses a device for stretching trousers, which includes a means for adjusting the stretching frame.

U.S. Pat. No. 886,400 discloses a shade roller which is of interest in the present invention, because it likewise discloses a means for securing the shade to the roller.

U.S. Pat. No. 1,546,400 granted to Nichols, Jul. 21, 1925, discloses a molding cloth stretcher wherein the cloth is secured to frame rollers by outwardly extending pins or the like and then the fabric is placed under tension.

U.S. Pat. No. 1,711,670 granted to Brennan, May 7, 1929, discloses a method for securing a screen to a framework.

U.S. Pat. No. 3,601,902 granted to Dubbs, Aug. 31, 1971, discloses a silk screen stretching frame and the method of attaching the screen to the frame, as well as increasing the tension thereon.

U.S. Pat. No. 3,908,293 granted to Newman, Sep. 30, 1975, discloses a silk screen frame, as well as a method of attaching the screen and adjusting the tension.

U.S. Pat. No. 4,860,467 granted to Larson, Aug. 29, 1989, discloses a silk screen frame, the method of attaching the screen and the means for adjusting the tension on the screen.

DISCLOSURE OF THE INVENTION

The present invention contemplates a silk screen frame device wherein the frame elements each include a removable strip to which the screen is attached. The strip is secured to the frame member in such a manner that adequate tension may be applied to the fabric, and further each of the frame elements includes an indexing means wherein the screen may be easily removed and replaced.

With the above-noted prior art and problems in mind, it is an object of the present invention to provide a silk screen frame wherein the screen may be easily removed from the frame and stored.

It is another object of the present invention to provide a silk screen frame including removable strips to which the silk screen is attached and wherein such strips are removable but provide reliable support during the tensioning and screening process.

A still further object of the present invention is to provide a silk screen frame wherein the tensioning upon the silk screen may be done from the exterior of the frame, permitting the use of automatic tensioning devices.

A further object of the present invention is to provide a precut silkscreen including a semi-rigid edge secured thereto wherein the cut screen and the edge accommodate the quality of the screen and the deflection of the frame when the screen is placed under the appropriate tension as well as the necessary presoftening of the corners.

Yet another object of the present invention is to provide a method of preparing a silkscreen for ready use comprising the steps of determining the frame size, determining the fabric to be used, placing the fabric over a mold/template containing edge members which have been preformed to compensate for the deflection of the frame when placed under tension, securing the fabric to the strips, and cutting the fabric to the shape of the strips, whereby the strips may be removably placed into grooves in the frame and the screen placed under tension, resulting in a predictable screen surface which may be stored without the frame.

BRIEF DESCRIPTION OF THE DRAWINGS

FIG. 3 is a cross-sectional view of one species of the side element of the present inventive frame.

FIG. 4 is a sectional view through another embodiment of the present invention.

FIG. 5 is an isometric view of a tensioning member with the securing strip exploded away for clarity.

FIG. 6 is a sectional view through the tensioning member of FIG. 5.

BEST MODE FOR CARRYING OUT THE INVENTION

Figure 1:
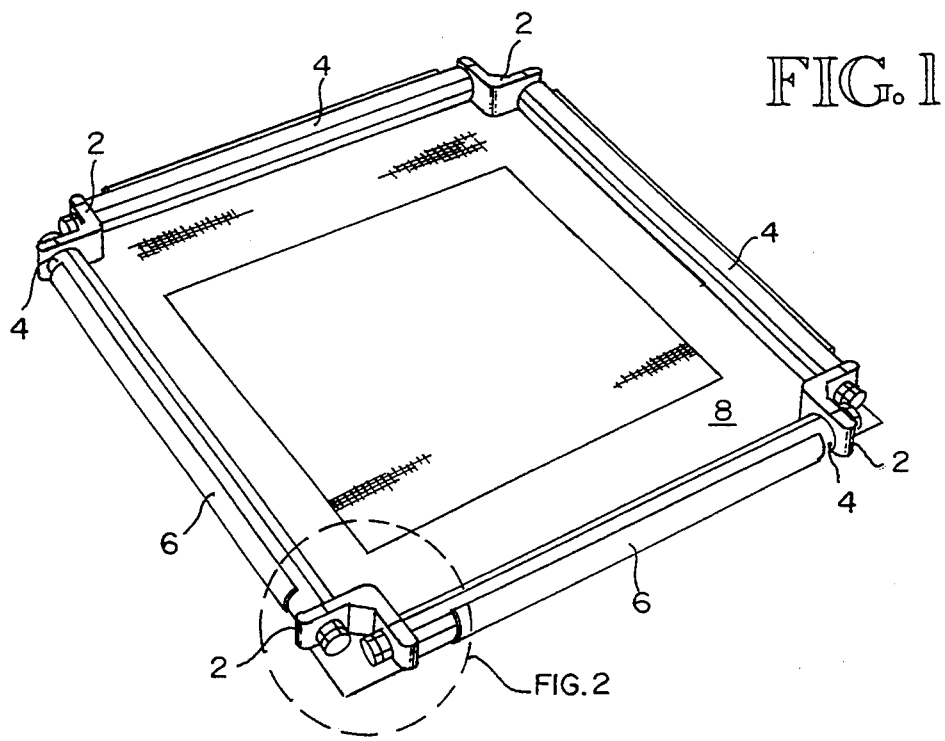
FIG. 1 is a pictorial representation of the present inventive framework from the back side.

As seen in FIG. 1, the present invention includes a silk screen frame including four corner elements 2 interconnected by tensioning rods or tubes 4 having mounted thereon removable strips 6 to which the screen 8 is secured. Use of the strips as explained hereinafter permit the removal and storage of screens while freeing up the frames for additional use.

Figure 2:
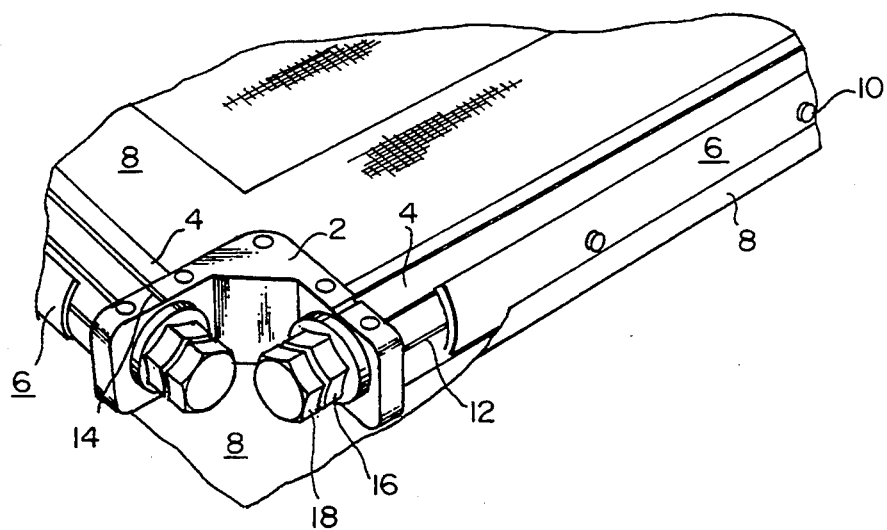
FIG. 2 is an enlarged view of the corner of the framework of FIG. 1.

Reference is now had to FIG. 2, which is an enlargement of the corner section of FIG. 1, and it can be seen that tensioning rods 4 which are in the configuration of hollow cylinders have the strips 6 secured thereto by means of radially outwardly extending projections 10, which slip into complementary holes in the strips 6. The screen fabric is adhesively secured to the strips 6. As will be explained hereinafter, the axial lines 12 on the roller 4 are used during the retensioning of the screen when it is replaced for reuse and are used in conjunction with the marking 14 on the corner 2. The means for securing the frame elements 4 such that the screen is in tension as well as creating the tension are illustrated with a jam nut 16 and a hex head 18 for use in manual turning of the tube 4 with a standard wrench to create tension on the screen secured thereto.

Reference is had to FIG. 3, which is a cross-section through the frame tube 4 and depicts the alignment grooves 12 as well as internal reinforcing ribs 20. A groove or slot 22 is adapted to receive a complementarily shaped strip 6, to which the fabric 8 is secured by adhesive. It is to be noted that the groove 22 includes a sloping front portion 24, a flat bottom 26 and a forwardly projecting lip 28 such that the strip 6, which includes complementarily shaped foot member 30 and flanges 34, 36, can be slid into the slot 22 and then held in position by the tension placed upon the screen itself.

Reference is now had to FIG. 4, wherein a strip 6 is secured to a tube 4 and has a generally identical configuration; however, the fabric 8 is held in position by means of a groove 38 formed in the strip 6, into which an elastic compressible member 40 is snapped.

Reference is now had to FIGS. 5 and 6, wherein the tube 4 includes a pair of diametrically opposed, somewhat flattened surfaces 42. Surfaces 42 lie within the circumference of the tube such that when the strip 6, having a downwardly projecting foot 44 complementary to slot 46 in the bottom of the flattened portion 42 of the tube 4, is in position, the fabric is presented with a substantially smooth, cylindrical surface. It is to be noted that a steel tube 48 is seen in the interior of the tube 4 in FIG. 6. The steel tube is used in large frames to reinforce the aluminum tube and reduce flexure.

Figure 7:
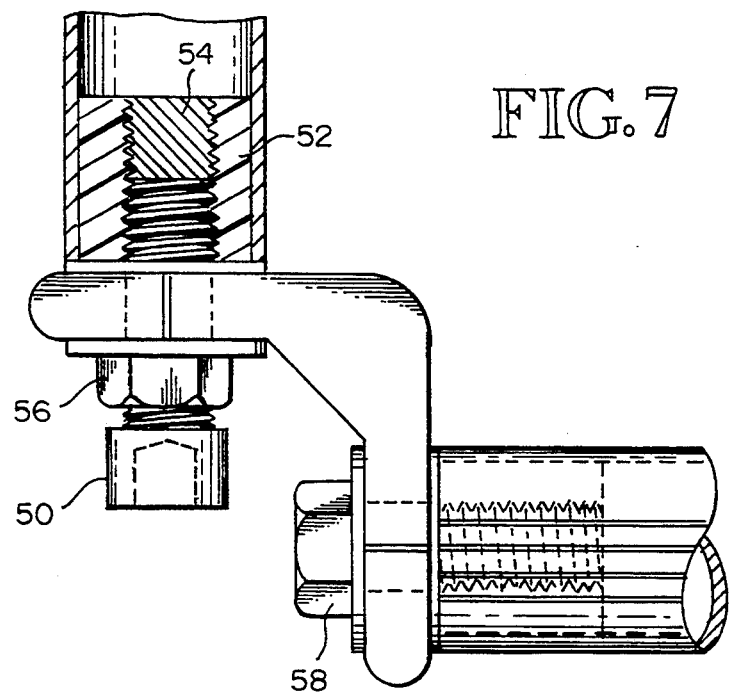
FIG. 7 is a sectional view through the corner of the inventive frame illustrating the means whereby the tension may be adjusted from a position exterior to the corner.

As seen in FIG. 7, a cap screw 50 may be substituted for hex head 18 in FIG. 2 to accommodate exterior tensioning means such as automatic tensioning. An aluminum plug 52 having an all-thread 54 seized therein is placed in the ends of the tensioning members 4. Loosening jam nut 56 allows adjustment of the screen tension by rotation of bolt 50. A standard hex head bolt 58 is used at the opposite end of each tube for locking purposes.

Although the inventive strip is shown in conjunction with a tube manufactured therefor, it is to be understood that with appropriate modifications it could be used with any retensionable frame having an axial slot along the exterior surface.

Figure 8:
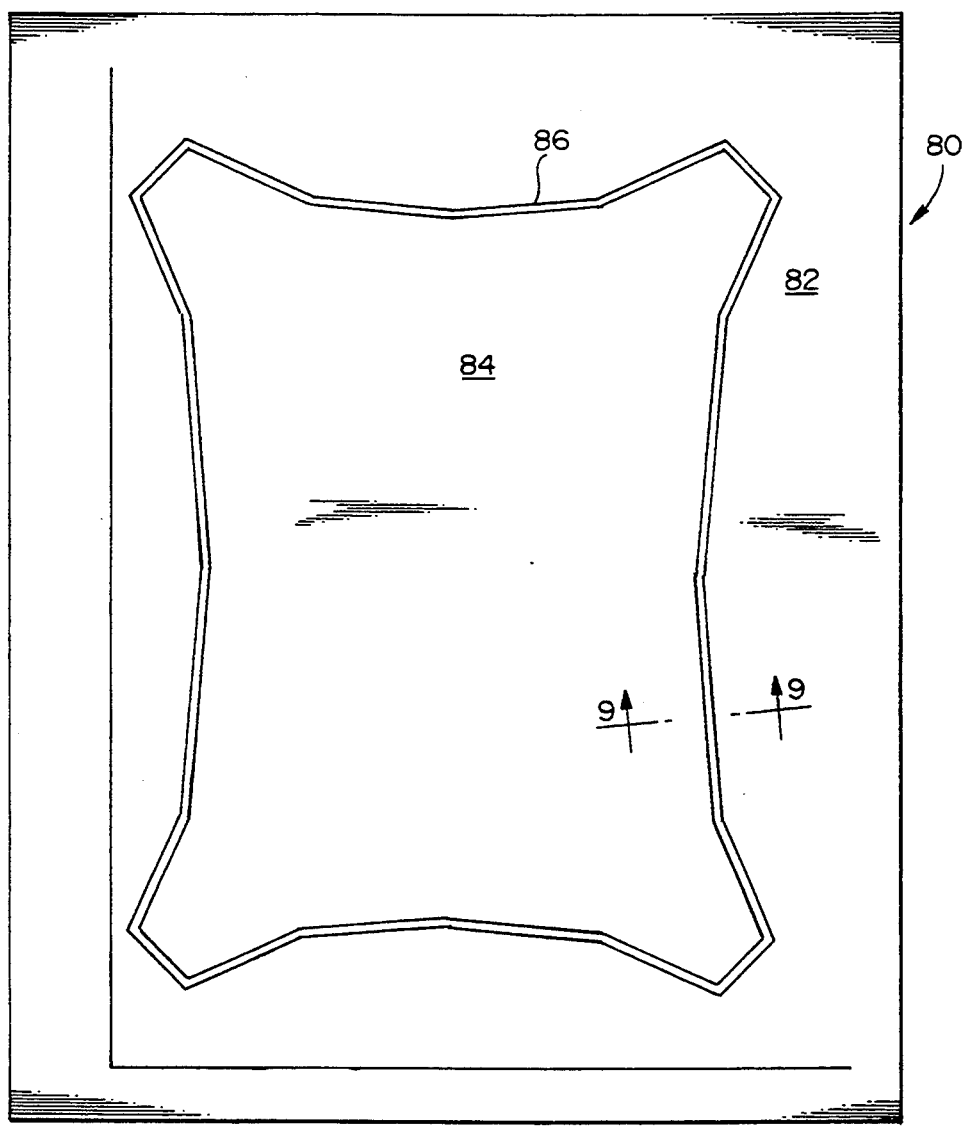
FIG. 8 is a plan view of the template or mold used in preparing the ready-to-use screen.

Reference is now had to FIG. 8, wherein a plan view of the template or mold is shown, it being understood that each frame size would have its own template or mold for the particular screen material to be used. As seen in this view, the template or mold comprises a solid piece of material 80 having an outer edge 82 and an inner surface 84, wherein the two surfaces 82, 84 are at different elevations as explained hereinafter. Separating the two surfaces 82, 84 is a groove 86 which is configured to represent the deflection of the frame when the particular fabric is put under tension as well as accommodating the corners.

Figure 9:
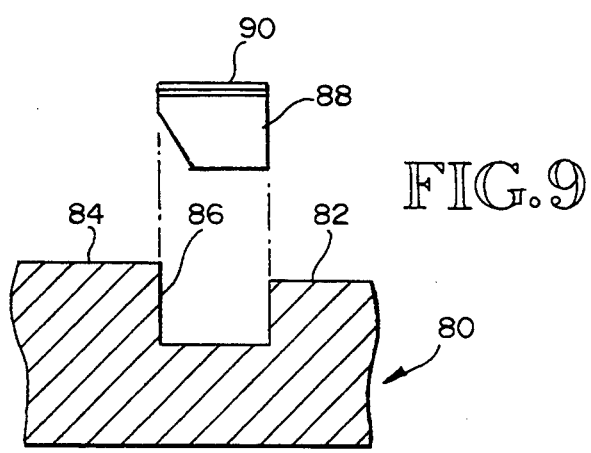
FIG. 9 is a section along 9—9 of FIG. 8 and including an exploded spline or edge element.

Referring now to FIG. 9, a section along lines 9—9 of FIG. 8, the outer surface 82 can be seen to be at a lower elevation than the inner surface 84 and a spline or edge member 88 having a double-sided tape 90 is about to be placed within the groove 86. The tape secures the fabric to the splines.

Figure 10:
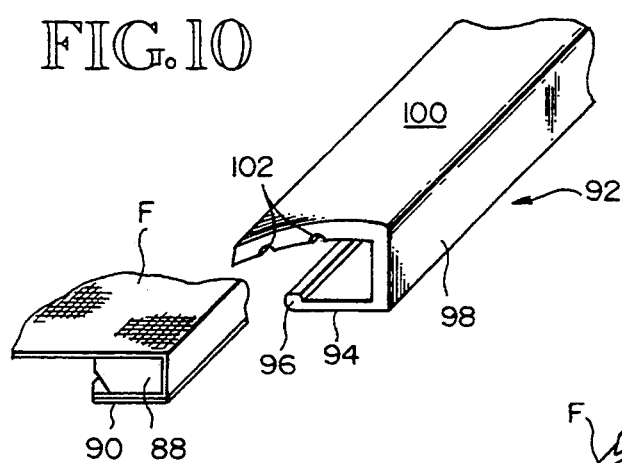
FIG. 10 is an exploded view showing the fabric secured to the spline or edge prior to insertion into a protective cover.
Figure 11:
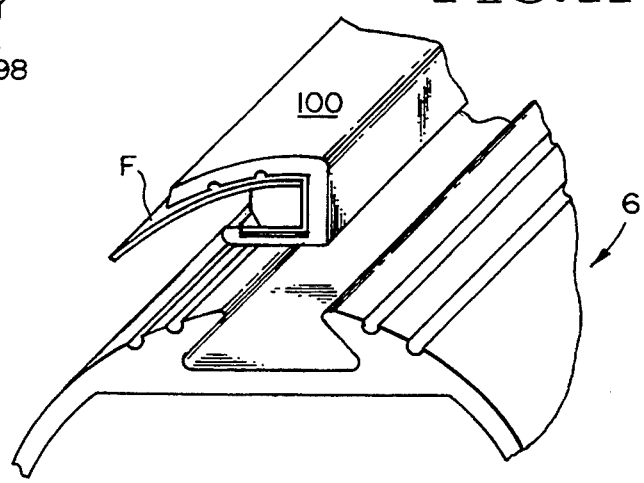
FIG. 11 is an exploded view of the fabric with the protective cover ready to be placed in one element of the frame.

As seen in FIG. 10, the silk screen fabric F with the spline 88 secured thereto is then inserted into an elongated protective shield 92 having a lower surface 94 including a lip 96, a rearward surface 98 substantially perpendicular to the bottom surface 94, and a wider, forwardly extending curved shield portion 100 including water and solvent traps 102. Prior to placing the fabric and an attached spline into the shield, an adhesive is placed in the shield such as the binding is permanent. FIG. 9 discloses how the fabric edge with the fabric secured thereto is removably inserted into a frame member 6, which includes a groove having outwardly and inwardly tapered sides to wedge the edges and hold the material in place during the tensioning of the device.

Figure 12:
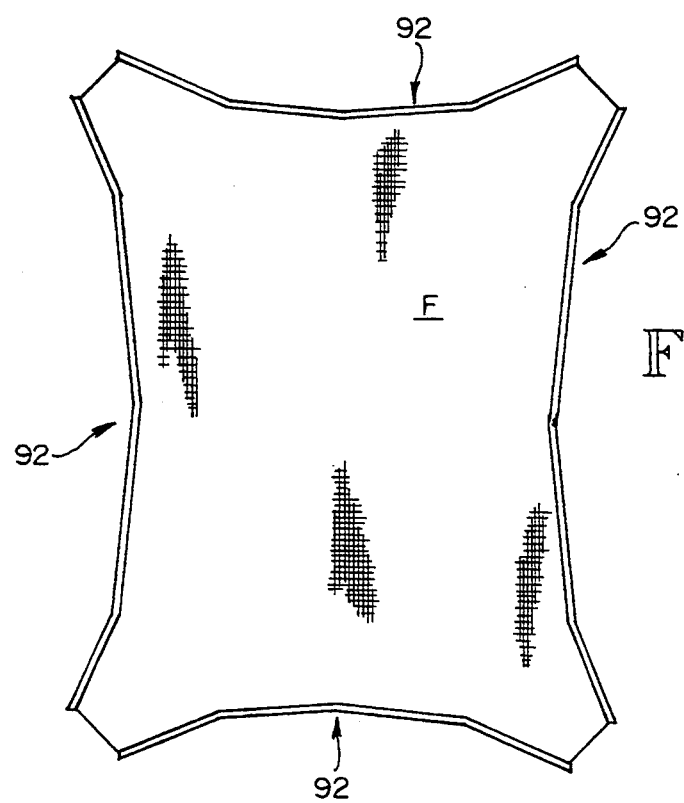
FIG. 12 is a plan view of the precut fabric with the spline and protective cover secured thereto.

As seen in FIG. 12, the fabric with the edges secured thereto is shown such as it would appear prior to the sale and during storage. As seen in this view, when removed from the frame itself, the edge and the fabric assumes the position that it would take when under the pressures that are necessary to hold the fabric steady and accomplish the silk screening steps.

Although preferred embodiments of the invention have been disclosed herein for illustration, it should be understood that various changes, modifications and substitutions may be incorporated in such embodiment without departing from the spirit of the invention, which is defined by the claims which follow:

What is claimed is:

1. A method of preparing a reusable and storable silk screen wherein the frame may be removed from the silk screen and used for another project and wherein the screen elements are quickly and easily reattached to the frame in the proper register for later use, comprising the steps of:
   a) determining the amount of frame deflection caused by the proper tension being placed upon the particular fabric for the size of the frame to be used;
   b) forming a flexible, resilient linking element to reflect the frame deflection;

c) cutting the silk screen fabric while in the relaxed state to have preformed curved edges which reflect the deflection of the frame; and d) securing the edge of the fabric to the temporarily preformed linking element, wherein the linking element interacts with and is capable of being removably secured to the frame, wherein the curvature of the preformed curved edges of said silk screen is such that when said silk screen is secured to the frame and tensioned, said preformed curved edges reflect the frame deflection, whereby the warp and weft of the fabric are perpendicular when the fabric is stretched;

e) securing the linking element to a protective shield which is shaped to provide a securement to the frame.

2. A method as in claim 1 wherein the fabric is cut after being attached to linking elements which have been preformed to accommodate the flexure of the frame.

3. A method as in claim 1, wherein each of the linking elements include a spline to which the fabric is attached and a shield member to protect the edge of the fabric and wherein the fabric is first attached to the spline and then the shield member is secured thereto.

4. A reusable silkscreen for use with a retensionable frame, including rotatable cylindrical frame elements, said silkscreen having been precut while in the relaxed state to have preformed curved edges which reflect the deflection of the frame elements when the silkscreen is placed under appropriate tension, wherein the curvature of the preformed curved edges being such that when said silk screen is secured to the frame and tensioned, said preformed curved edges reflect the frame deflection, whereby the warp and weft are normal to each other when the screen is under tension, said silkscreen including flexible strips secured thereto extending along substantially the length of each edge thereof and a protective shield which is adapted for releasable securement to the frame, whereby the screen may be quickly and easily attached to and released from a frame.

5. A reusable silk screen comprising:

a retensionable frame to compensate for stretching of a screen while in use, a plurality of flexible edge strips which have been preformed to the shape that they will assume when secured to the frame and placed under the appropriate tension, said tension determined by the silkscreen to be used and the frame size, said edge strips being of a length to provide an exposed edge portion of said silkscreen at each corner thereof to permit the presoftening of the corners of the silkscreen, and a piece of silkscreen fabric which is cut in the relaxed state to have preformed curved edges which reflects the deflection of the frame, said flexible edge strips being secured to said preformed curved edges, the curvature of said preformed curved edges being such that when said silk screen is secured to the frame and tensioned, said performed curved edges reflect the frame deflection, whereby the silkscreen, when not attached to a frame, has preformed curved edges which reflect the predicted frame deflection and the screen and its attached strips may be removed from the frame and stored until a time for reuse.

* * * * *